(12) United States Patent
Han et al.

(10) Patent No.: US 7,944,320 B2
(45) Date of Patent: May 17, 2011

(54) ELECTROMAGNETIC BANDGAP STRUCTURE AND PRINTED CIRCUIT BOARD INCLUDING MULTI-VIA

(75) Inventors: Mi-Ja Han, Jeonju-si (KR); Han Kim, Yongin-si (KR); Ja-Bo Koo, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 527 days.

(21) Appl. No.: 12/076,650

(22) Filed: Mar. 20, 2008

(65) Prior Publication Data
US 2009/0071709 A1 Mar. 19, 2009

(30) Foreign Application Priority Data
Sep. 18, 2007 (KR) .................. 10-2007-0094919

(51) Int. Cl.
*H01P 1/20* (2006.01)
*H01P 5/08* (2006.01)

(52) U.S. Cl. ............................ 333/12; 333/167; 333/185

(58) Field of Classification Search ............... 333/167, 333/168, 185, 212, 12
See application file for complete search history.

(56) References Cited

U.S. PATENT DOCUMENTS
7,136,029 B2 * 11/2006 Ramprasad et al. ........... 343/909
2010/0108373 A1 * 5/2010 Park ............................... 174/376
* cited by examiner

*Primary Examiner* — Robert Pascal
*Assistant Examiner* — Kimberly E Glenn

(57) ABSTRACT

An electromagnetic bandgap structure and a printed circuit board that intercepts to transfer a signal having a predetermined frequency band are disclosed. In particular, the electromagnetic bandgap structure includes a first metal layer and a second metal layer; a metal plate, placed between the first metal layer and a second metal layer; a multi-via, penetrating the first metal layer, passing through the same planar surface as an outer metal layer and turning toward the first metal layer to connect the metal plate and the first metal layer; and a dielectric layer, stacked in between the first metal layer and the metal plate, between the metal plate and the second metal layer and between the first metal layer and the outer metal layer. With the present invention, a bandgap frequency can be decreased without increasing the size of the metal plate.

16 Claims, 18 Drawing Sheets

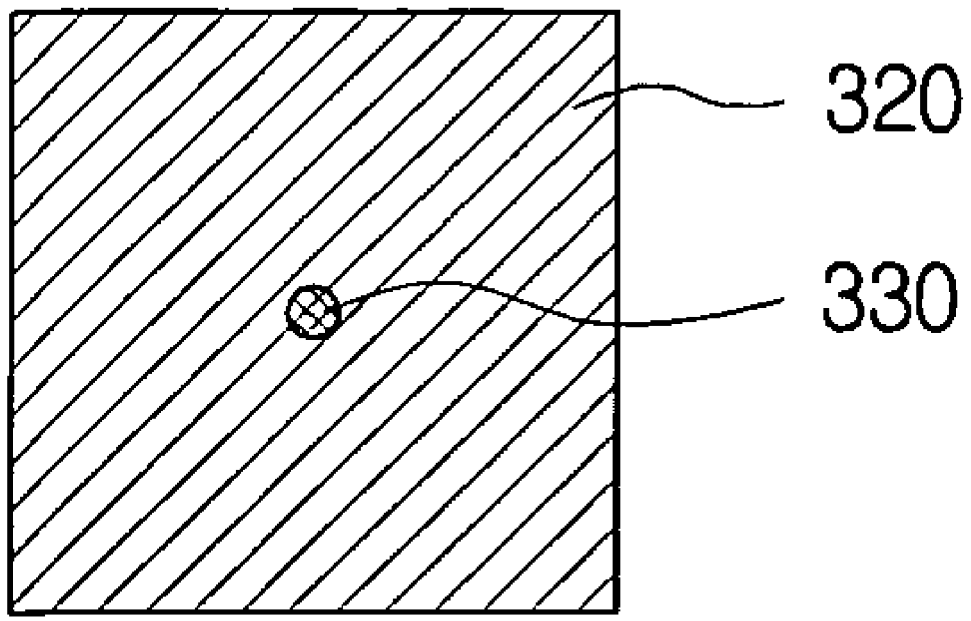

ELECTROMAGNETIC BANDGAP STRUCTURE AND PRINTED CIRCUIT BOARD INCLUDING MULTI-VIA

CROSS-REFERENCE TO RELATED PATENT APPLICATIONS

This application Claims the benefit of Korean Patent Application No. 10-2007-0094919, filed on Sep. 18, 2007, in the Korean Intellectual Property Office, the disclosure of which is incorporated herein in its entirety by reference.

BACKGROUND OF THE INVENTION

1. Field of the Invention

The present invention relates to a printed circuit board, more specifically to an electromagnetic bandgap structure and a printed circuit board that solve a problem mixed signals between an analog circuit and a digital circuit.

2. Background Art

Various apparatuses such as mobile communication terminals, personal digital assistants (PDA), laptop computers and digital multimedia broadcasting (DMB) devices have been launched in order to meet today's trend that mobility is considered as one of the most important issues.

Such apparatuses include a printed circuit board, which is configured to compound analog circuits (e.g. radio frequency (RF) circuits) and digital circuits for wireless communication.

FIG. 1 is a sectional view showing a printed circuit board including an analog circuit and a digital circuit. Although a 4-stacked in printed circuit board is illustrated, various printed circuit boards such as 2 and 6-stacked in printed circuit boards can be applied. Here, the analog circuit is assumed to be an RF circuit.

The printed circuit board 100 includes metal layers 110-1, 110-2, 110-3 and 110-4 (hereinafter, collectively referred to as 110), dielectric layers 120-1, 120-2 and 120-3 (hereinafter, collectively referred to as 120) stacked in between the metal layers 110, a digital circuit 130 mounted on the top metal layer 110-1 and an RF circuit 140.

If it is assumed that the metal layer 110-2 is a ground layer and the metal layer 110-3 is a power layer, each layer supplies powers to each circuit through a via 160 and the printed circuit board 100 performs a predetermined operation or function.

Here, an operation frequency of the digital circuit 130 and an electromagnetic (EM) wave 150 by harmonics components are transferred to the RF circuit 140, to thereby generate a problem mixed signals. The problem mixed signals is generated due to the EM wave, having a frequency within the frequency band in which the RF circuit 140 is operated, in the digital circuit 130. This problem results in obstructing the accurate operation of the RF circuit 140. For example, when the RF circuit 140 receives a signal having a certain frequency band, transferring the EM wave 150 including the signals having the certain frequency band from the digital circuit 130 may make it difficult to accurately receive the signal having the certain frequency band.

Solving the problem mixed signals becomes more difficult due to the increased complexity of electronic apparatuses and the higher operation frequency of the digital circuit 130.

The decoupling capacitor method, which is a typical solution for power noise, is not adequate for high frequencies. Accordingly, it is necessary to intercept or decrease the noise of the high frequencies between the RF circuit 140 and the digital circuit 130.

FIG. 2 is a sectional view showing an electromagnetic bandgap structure that solves a problem mixed signals between an analog circuit and a digital circuit in accordance with a conventional art, and FIG. 3 is a plan view showing a metal plate configuration of the electromagnetic bandgap structure shown in FIG. 2. FIG. 4 is a perspective view showing the electromagnetic bandgap structure shown in FIG. 2, and FIG. 5 is a schematic view showing an equivalent circuit of the electromagnetic bandgap structure shown in FIG. 2.

The electromagnetic bandgap structure 200 includes a first metal layer 210-1, a second metal layer 210-2, a first dielectric layer 220a a second dielectric layer 220b, a meal plate 232 and a via 234.

The first metal layer 210-1 and the metal plate 232 are connected to each other through the via 234. A mushroom type structure 230 is formed to include the metal plate 232 and the via 234 (refer to FIG. 4).

If the first meal layer 210-1 is a ground layer, the second metal layer 210-2 is a power layer. Also, if the first metal 210-1 is the power layer, the second layer 210-2 is the ground layer.

In other words, the repeated formation of the mushroom type structure 230 (refer to FIG. 3) results in a bandgap structure preventing a signal having a certain frequency band from being penetrated. At this time, the mushroom type structures 230, including the metal plates 232 and the vias 234, are repeatedly formed between the ground layer and the power layer.

The function preventing a signal having a certain frequency band from being penetrated, which is based on resistance $R_E$ and $R_P$, inductance $L_E$ and $L_P$, capacitance $C_E$, $C_P$ and $C_G$ and conductance $G_P$ and $G_E$, is approximated to the equivalent circuit shown in FIG. 5.

A mobile communication terminal is a good example for an electronic apparatus employing the board realized with the digital circuit and the RF circuit together. In the case of the mobile communication terminal, solving the problem mixed signals needs the noise shielding of an operation frequency band of the RF circuit between 0.8 and 1.0 GHz. The small sized mushroom type structure is also required. However, the foregoing electromagnetic bandgap structure may not satisfy the two conditions needed to solve the problem mixed signals.

Since the smaller sized mushroom type structure causes the bandgap frequency band shielding the noise to be increased, the mobile communication terminal is not effectively operated in the operation frequency band of the RF circuit between 0.8 and 1.0 GHz.

SUMMARY OF THE INVENTION

Accordingly, the present invention provides an electromagnetic bandgap structure and a printed circuit board that can allow the size not to be increased and have a low bandgap frequency band.

The present invention also provides an electromagnetic bandgap structure and a printed circuit board that can solve a problem mixed signals in an electronic apparatus (e.g. a mobile communication terminal) employing the board having the digital circuit and the RF circuit, realized therein together.

In addition, the present invention provides an electromagnetic bandgap structure and a printed circuit board that can allow the noise having a certain frequency band not to penetrate it.

According to an aspect of the present invention, there is provided an electromagnetic bandgap structure intercepting to transfer a signal having a predetermined frequency band.

According to an embodiment of the present invention, the electromagnetic bandgap structure includes a first metal layer; a second metal layer; a metal plate, placed between the first metal layer and a second metal layer, the metal plate having a size; a multi-via, penetrating the first metal layer from the metal plate, passing through a same planar surface of an outer metal layer and turning toward the first metal layer to connect the metal plate and the first metal layer; and a dielectric layer, stacked in between the first metal layer and the metal plate, between the second metal layer and the metal plate and between the first metal layer and the outer metal layer.

The multi-via can have a plurality of vias and an interconnection pattern, connecting the vias.

Here, the multi-via can include an interconnection pattern, placed on a same planar surface of the outer metal layer and formed in a clearance hole formed on the outer metal layer; a first via, having one end part, which is connected to the metal plate and penetrates the first metal layer, and the other end part, which is connected to one end part of the interconnection pattern; and a second via, having one end part, which is connected to the first metal layer, and the other end part, which is connected to the other end part of the interconnection pattern.

The multi-via can include a first interconnection pattern, placed on a same surface of the first metal layer and formed in a clearance hole formed on the first metal layer; a second interconnection pattern, placed on a same surface of the outer metal layer and formed in a clearance hole formed on the outer metal layer; a first via, having one end part, which is connected to the metal plate, and the other end part, which is connected to one end part of the first interconnection pattern; a second via, having one end part, which is connected to the other end part of the first interconnection pattern, and the other end part, which is connected to one end part of the second interconnection pattern; and a third via, having one end part, which is connected to the first metal layer, and the other end part, which is connected to the other end part of the second interconnection pattern.

The interconnection pattern has a straight-line, an at least-one-time-turned straight-line shape, a curved shape and a spiral shape.

In the meantime, a plurality of mushroom type structures including the metal plate and the multi-via can be placed between the first metal layer and the second metal plate. Here, the metal plates of the plurality of mushroom type structures can have the same size. Alternatively, the metal plates of the plurality of mushroom type structures can be distinguished into a plurality of groups having different metal plate sizes.

According to another aspect of the present invention, there is provided a printed circuit board having an analog circuit and a digital circuit that intercept the transfer of signals from the digital circuit to analog circuit.

According to an embodiment of the present invention, a printed circuit board includes an analog circuit and a digital circuit, the electromagnetic bandgap structure including a first metal layer, a metal plate, a second metal layer, a multi-via and a dielectric layer being arranged between the analog circuit and the digital circuit. Here, the metal plate is placed between the first metal layer and the second metal layer; the multi-via penetrates the first metal layer from the metal plate, passes through the same planar surface as an outer metal plate and turns toward the first metal layer to connect the metal plate and the first metal layer; and the dielectric layer is stacked in between the first metal layer and the metal plate, between the second metal layer and the metal plate and between the first metal layer and the outer metal layer The metal layer can be any one of a ground layer and a power layer, and the second metal layer is the other layer The analog circuit is a radio frequency (RF) including an antenna receiving a wireless signal from an outside.

BRIEF DESCRIPTION OF THE DRAWINGS

These and other features, aspects and advantages of the present invention will become better understood with regard to the following description, appended Claims and accompanying drawings where:

FIG. 9A through FIG. 9D are plan views showing each layer of the electromagnetic bandgap structure shown in FIG. 6 and FIG. 7;

DESCRIPTION OF THE EMBODIMENTS

Figure 1:
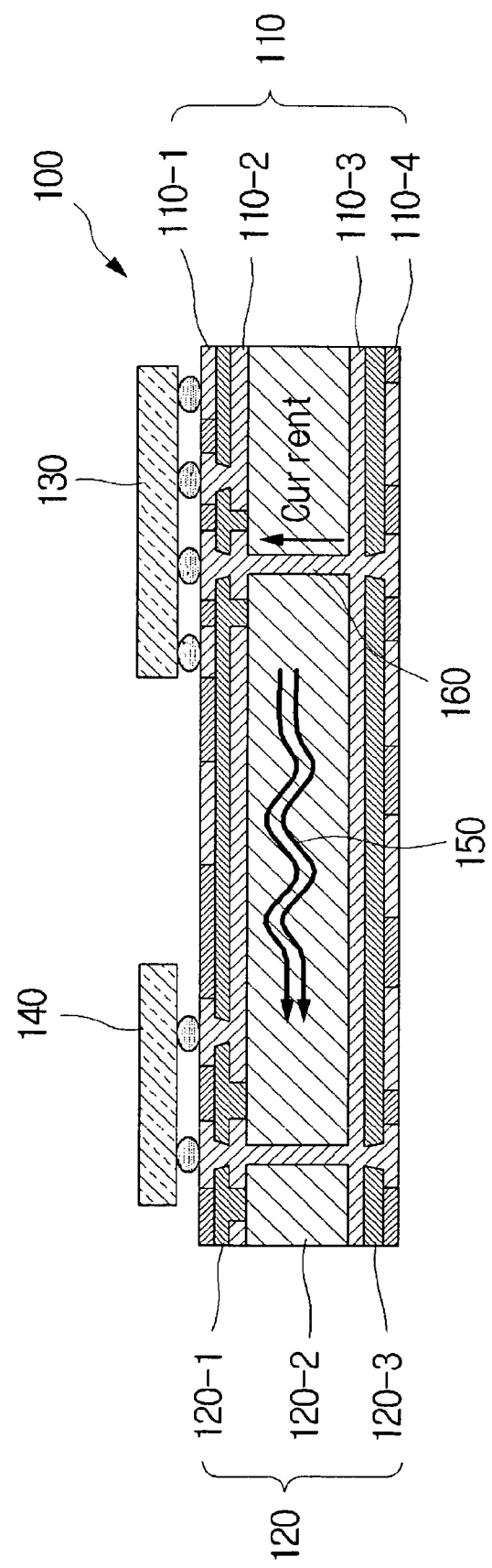
FIG. 1 is a sectional view showing a printed circuit board including analog circuit and a digital circuit.
Figure 2:
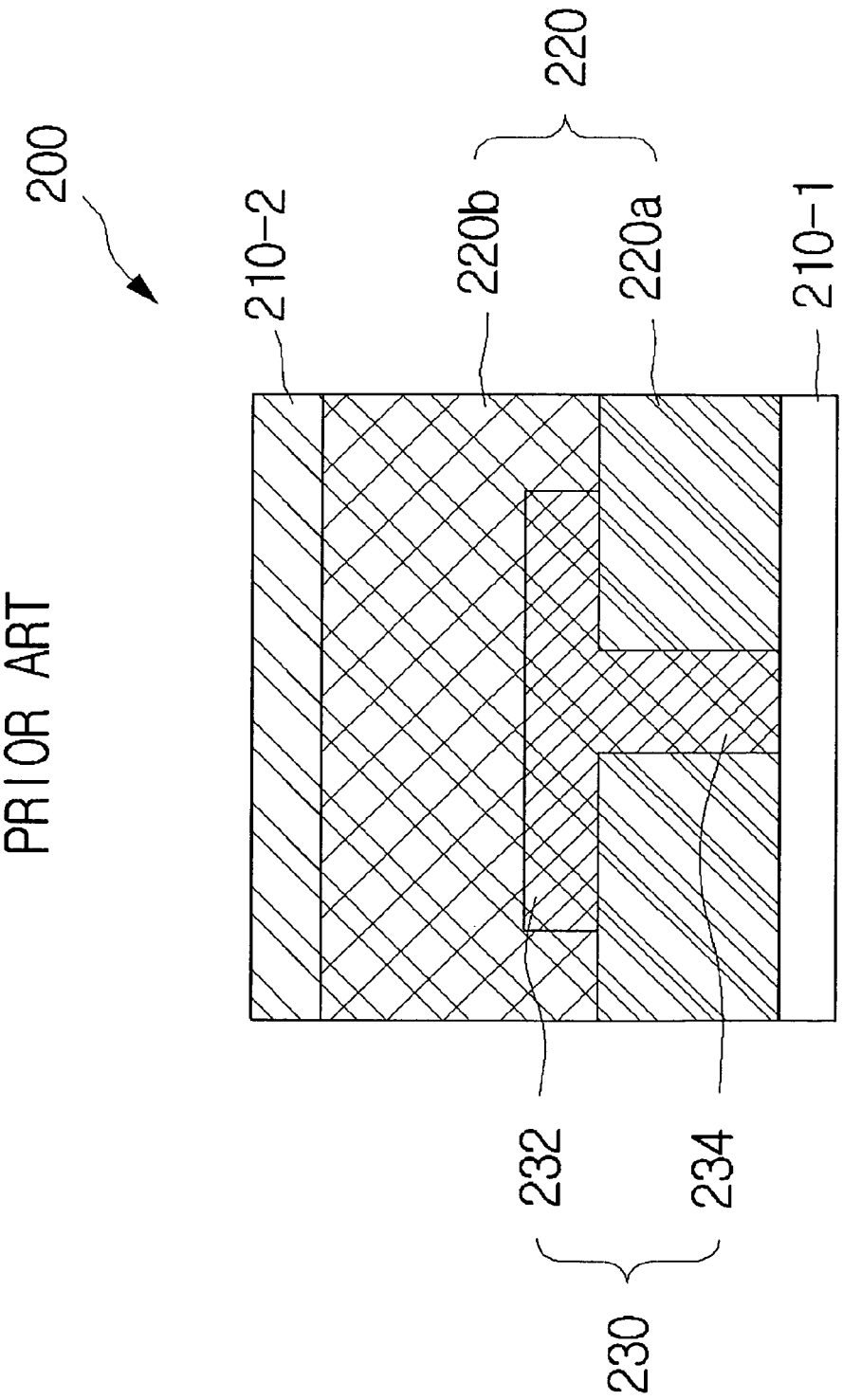
FIG. 2 is a sectional view showing an electromagnetic bandgap structure that solves a problem mixed signals between an analog circuit and a digital circuit in accordance with a conventional art.
Figure 3:
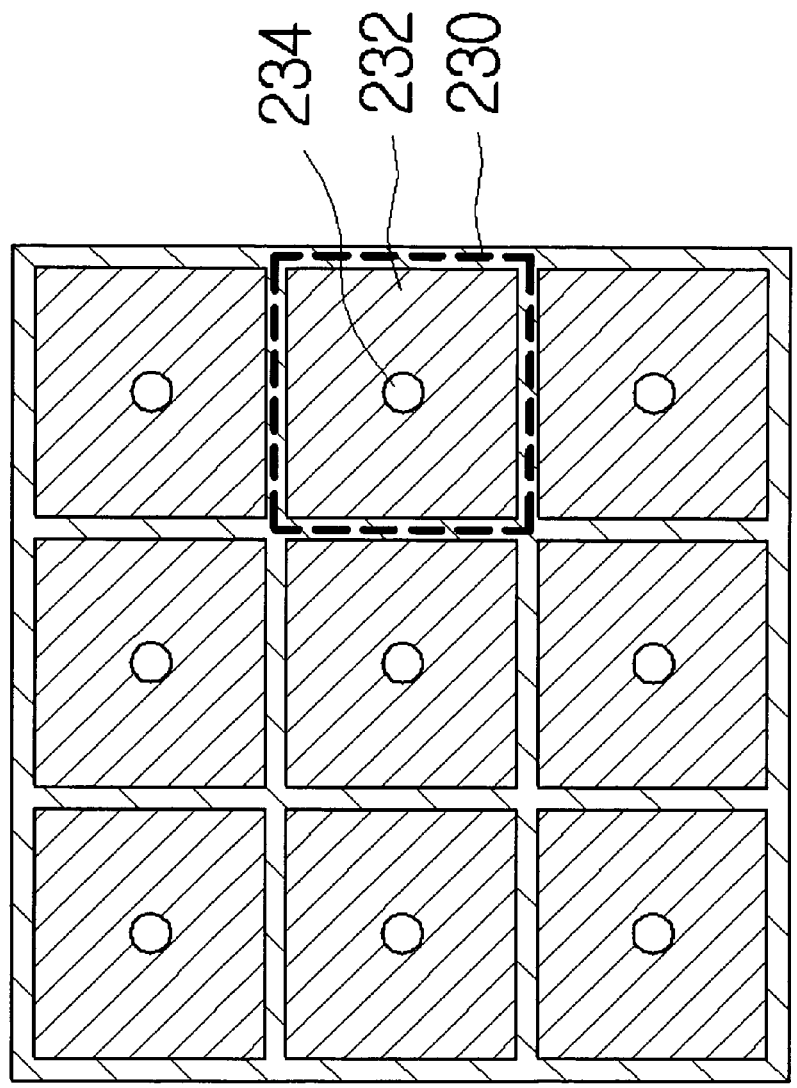
FIG. 3 is a plan view showing a metal plate configuration of the electromagnetic bandgap structure shown in FIG. 2.

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention. Throughout the drawings, similar elements are given similar reference numerals. Throughout the description of the present invention, when describing a certain technology is determined to evade the point of the present invention, the pertinent detailed description will be omitted.

Terms such as "first" and "second" can be used in describing various elements, but the above elements shall not be restricted to the above terms. The above terms are used only to distinguish one element from the other.

The terms used in the description are intended to describe certain embodiments only, and shall by no means restrict the present invention. Unless clearly used otherwise, expressions in the singular number include a plural meaning. In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

Hereinafter, some embodiments of the present invention will be described in detail with reference to the accompanying drawings.

Figure 6:
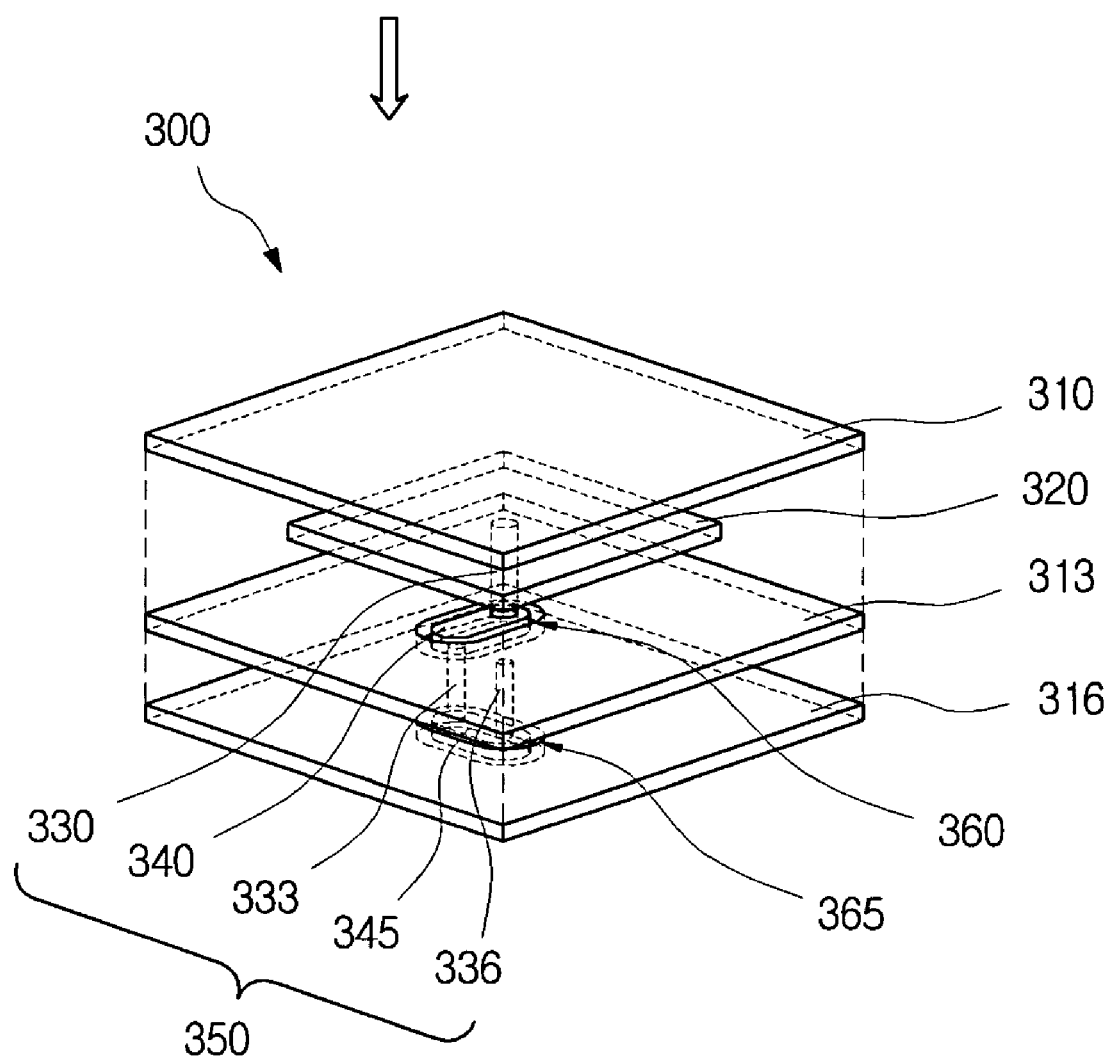
FIG. 6 is a 3-D perspective view showing an electromagnetic bandgap structure viewed downwardly from an upper side in accordance with an embodiment of the present invention.
Figure 7:
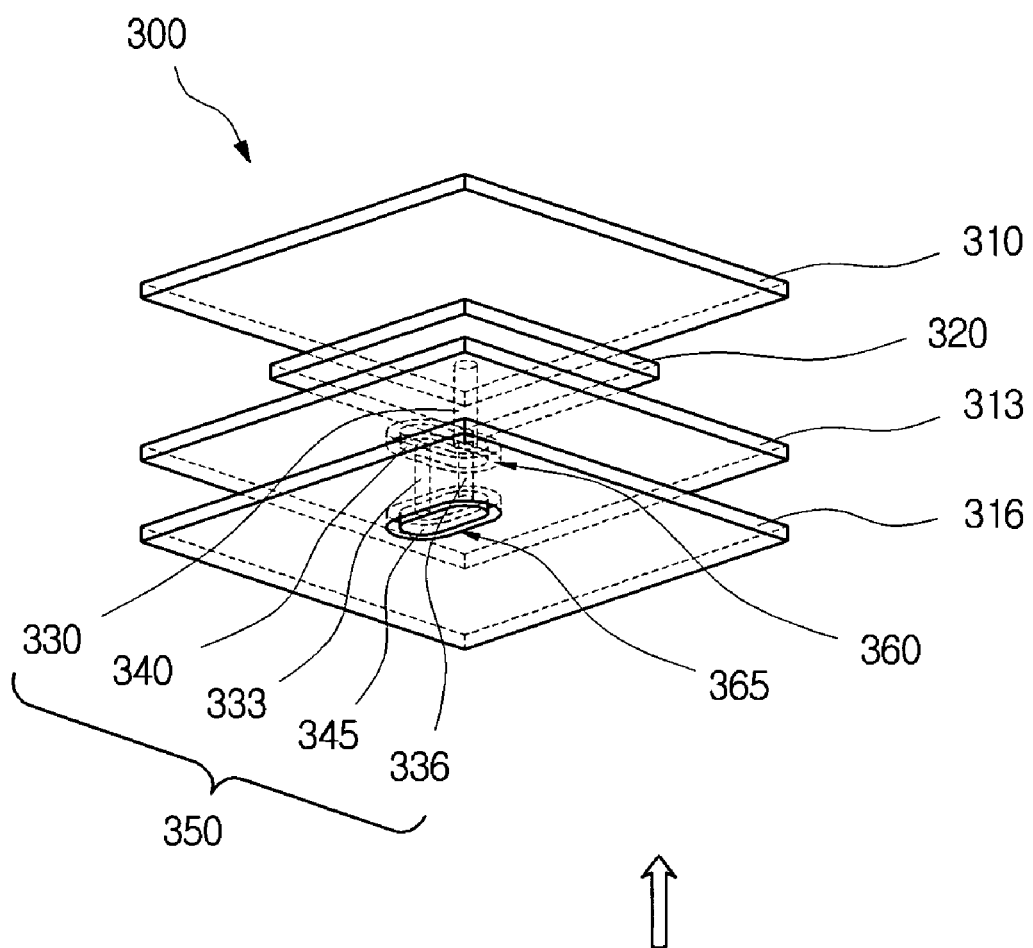
FIG. 7 is a 3-D perspective view showing an electromagnetic bandgap structure, shown in FIG. 6, viewed upwardly from a lower side.
Figure 8:
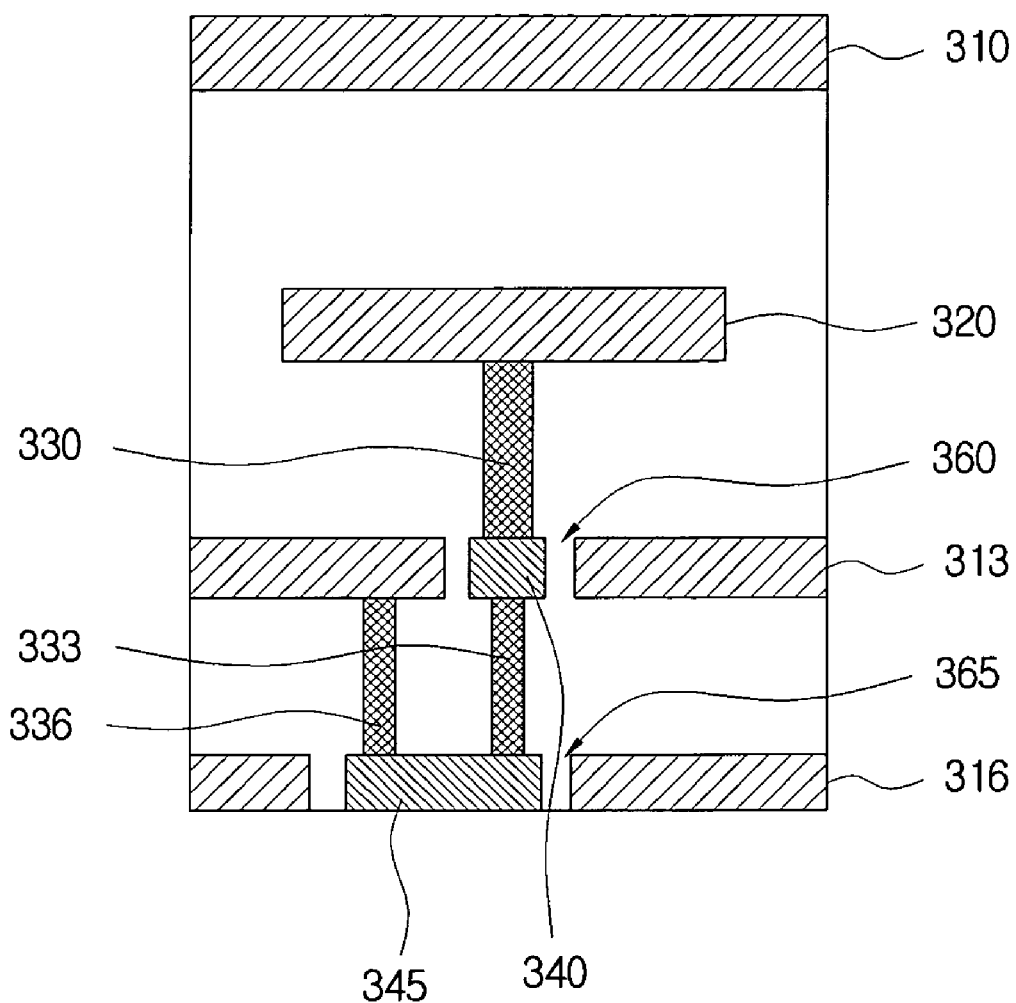
FIG. 8 is a sectional view showing the electromagnetic bandgap structure shown in FIG. 6 and FIG. 7.
Figure 9A:
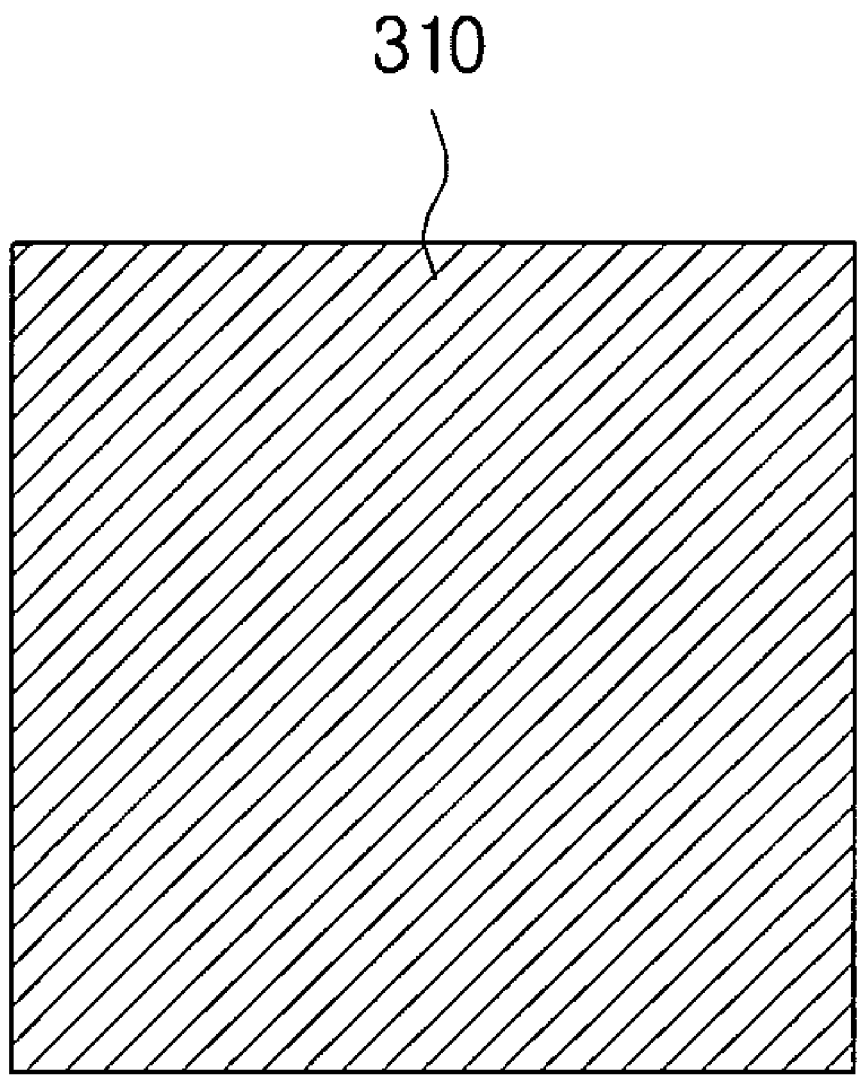
Figure 9C:
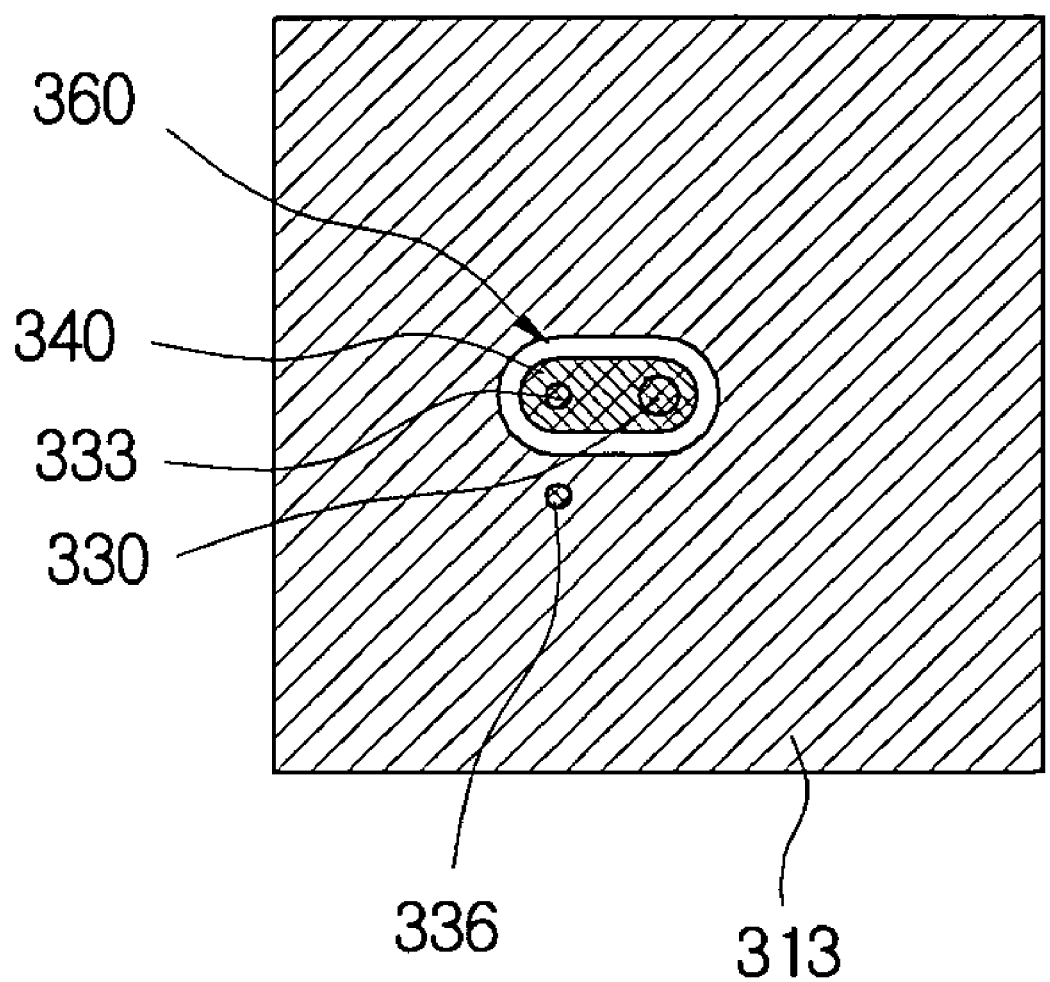
Figure 9D:
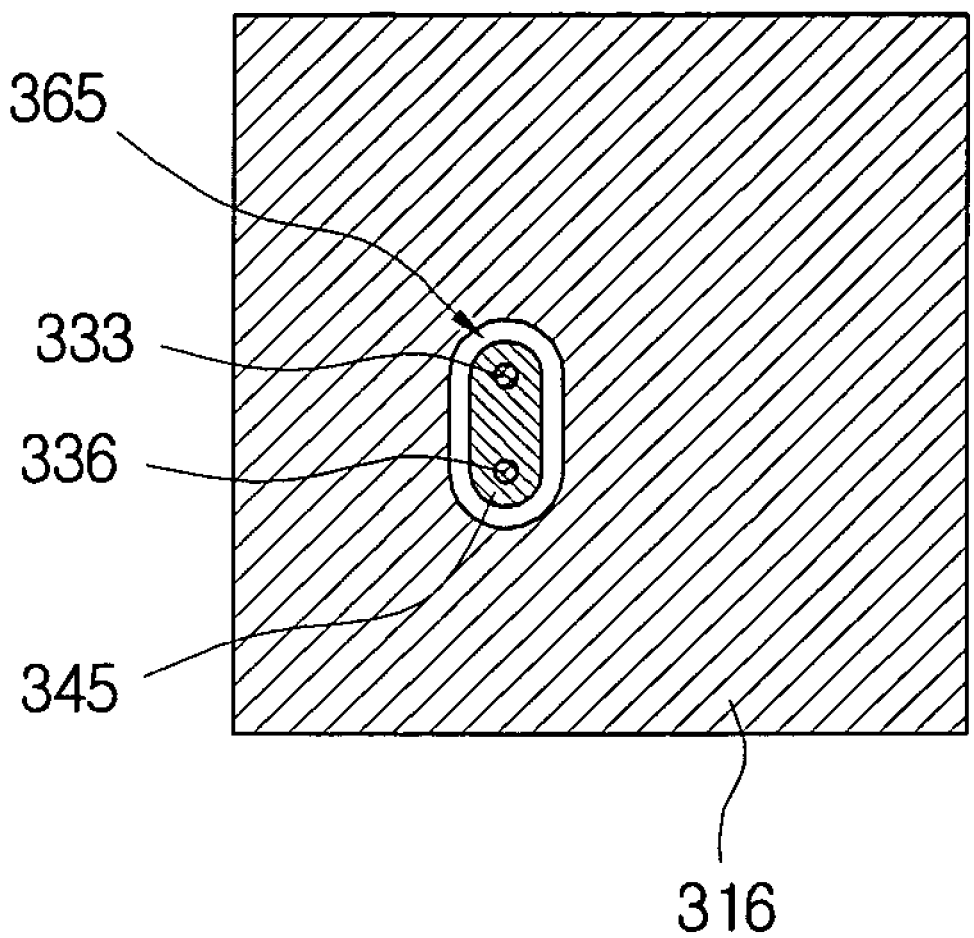

FIG. 6 is a 3-D perspective view showing an electromagnetic bandgap structure viewed downwardly from an upper side in accordance with an embodiment of the present invention, FIG. 7 is a 3-D perspective view showing an electromagnetic bandgap structure, shown in FIG. 6, viewed upwardly from a lower side, FIG. 8 is a sectional view showing the electromagnetic bandgap structure shown in FIG. 6 FIG. 7 and FIG. 9A through FIG. 9D are plan views showing each layer of the electromagnetic bandgap structure shown in FIG. 6 and FIG. 7.

Referring to the aforementioned figures, the electromagnetic bandgap structure 300, which can include a first metal layer 313, a second metal layer 310, a third metal layer 316, a metal plate 320 and a multi-via 350 (including a first via 330, a second via 333, a third via 336, a first interconnection pattern 340 and a second interconnection pattern 345), a first clearance hole 360 and a second clearance hole 365, is illustrated. FIG. 9A through FIG. 9D are plan views showing the second metal layer 310, the metal plate 320, the first meal layer 313 and the third layer 316, respectively.

Between the first metal layer 313 and the second metal layer 310 can be placed the metal plate 320. A dielectric layer consisting of dielectric materials can be placed between the first metal layer 313 and the metal plate 320 and between the metal plate 320 and the second metal layer 310. The dielectric layer can be divided into two subdielectric layers, each of which is placed on either side of the metal plate 320. Each subdielectric layer can consist of the same dielectric materials, materials having the same dielectric constants or different dielectric materials.

If the first metal layer 313 is a ground layer, the second metal layer 310 can be a power layer. Also, if the first metal layer 313 is the power layer, the second metal layer 310 can be the ground layer. In other words, the first metal layer 313 and the second metal layer 310 can be configured to include the ground layer and the power layer, which are close to each other and the dielectric layer is placed therebetween. The metal plate 320 can be placed between the ground layer and the ground layer.

Although the related figures illustrate the metal plate 320 having a regular square shape, the metal plate 320 can have various shapes such as polygons, circles and ellipses.

The third metal layer 316 can be placed to face the metal plate 320, and the first metal layer 313 can be placed between the third metal layer 316 and the metal plate 320. The third metal layer 316 can also correspond to the metal layer placed outside the foregoing typical electromagnetic bandgap structure including the first metal layer 313, the metal plate 320 and the second metal layer 310.

In accordance with an embodiment of the present invention, the multi-via 350 can include the first via 330, the second via 333, the third via 336, the first interconnection pattern 340, and the second interconnection pattern 345. The multi-via 350 can refer to the structure consisting of a plurality of vias, connecting the metal plate 320 and the first metal layer 313, and interconnection patterns.

The first via 330 can have one end part, which is connected to the metal plate 320, and the other end part, which is connected to one end part of the first interconnection pattern 340. The first interconnection pattern 340 can be formed on the same planar surface as the first metal layer 313 and placed in the first clearance hole 360, formed on the first metal layer 313, so as to be electrically disconnected to the first metal layer 313.

The second via 330 can have one end part, which is connected to the other end part of the first interconnection pattern 340, and the other end part, which is connected to one end part of the second interconnection pattern 345. The second interconnection pattern 345 can be formed on the same planar surface as the third metal layer 316 and placed in the second clearance hole 360, formed on the third metal layer 316, so as to be electrically disconnected to the third metal layer 313.

The third via 336 can have one end part, which is connected to the other end part of the second interconnection pattern 345, and the other end part, which is connected to one end part of the first metal layer 313.

The multi-via 350 can be connected in series in the order of the first via 330, the first interconnection pattern 340, the second via 333, the second interconnection pattern 345 and the third via 336, in order to electrically connecting the metal plate 320 and the first metal layer 313. In other words, when connecting the metal plate 320 and the first metal layer 313, it is possible to acquire enough inductance. Also, the capacitance can be acquired by allowing the first interconnection pattern 340 and the second interconnection pattern 345 to be placed in the first clearance hole 360 of the first metal layer 313 and the second clearance hole 365 of the third metal layer 316, respectively, and thus each interconnection pattern to be spaced at predetermined intervals from the metal layer.

Figure 4:
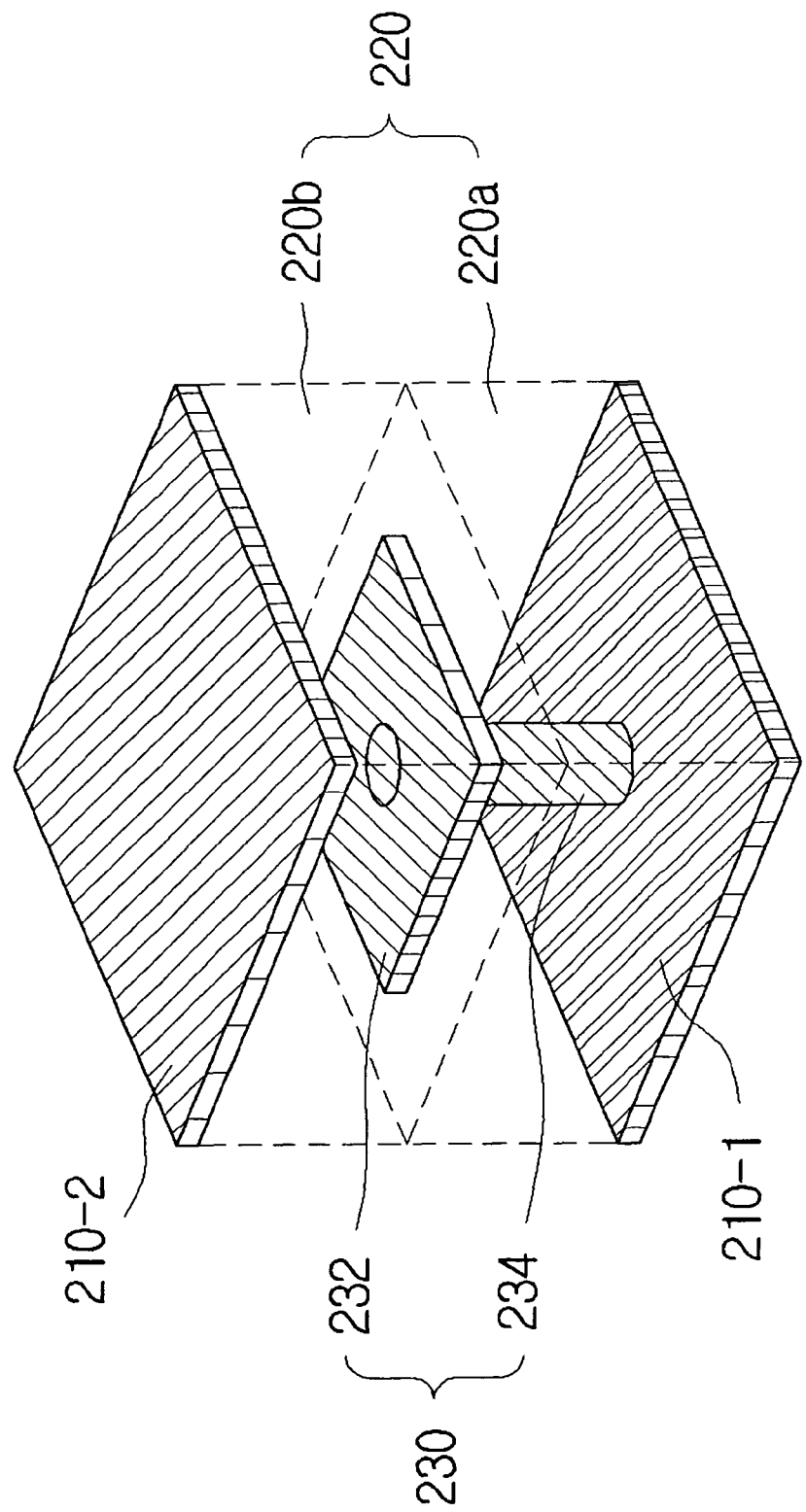
FIG. 4 is a perspective view showing the electromagnetic bandgap structure shown in FIG. 2.
Figure 5:
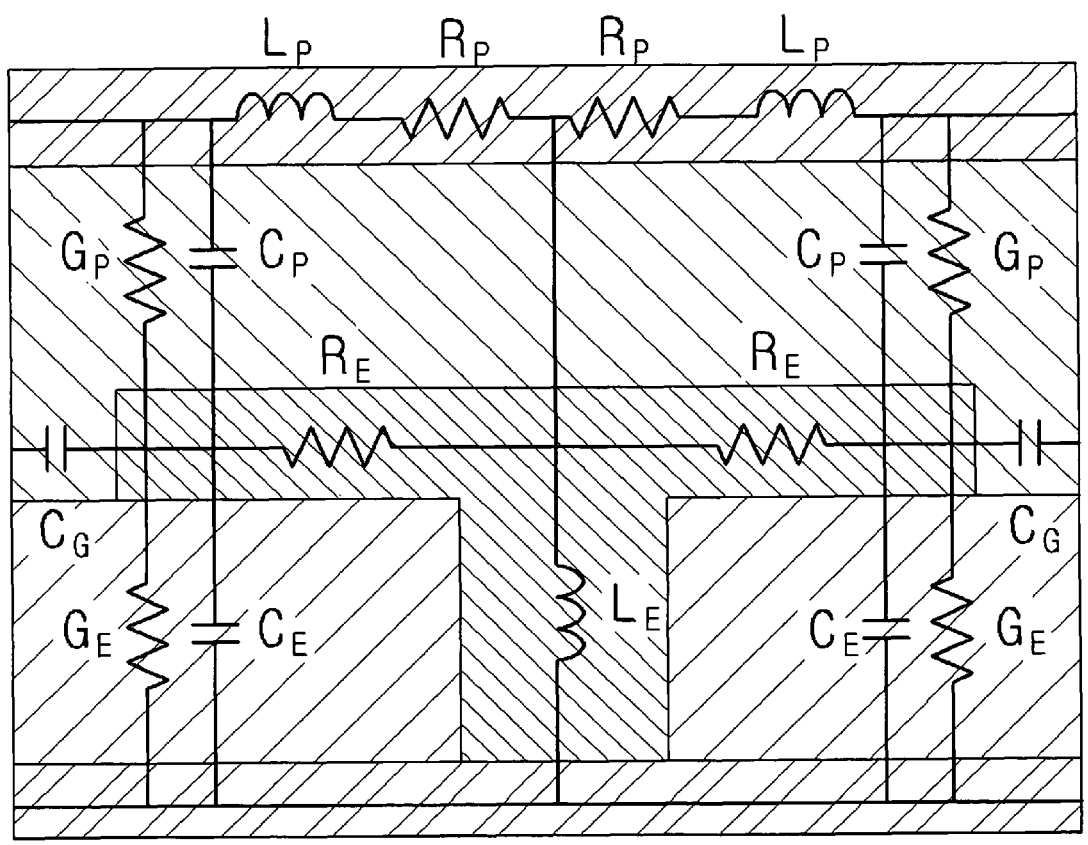
FIG. 5 is a schematic view showing an equivalent circuit of the electromagnetic bandgap structure shown in FIG. 2.

Accordingly, if the metal plate 320 has the same size, it is possible to lower the bandgap frequency band as compared with the typical electromagnetic bandgap structure illustrated in FIG. 4.

In an embodiment of the present invention, the positions of the first via 330, the second via 333 and the third via 336 are not limited to the positions illustrated in FIG. 6 through 9D. Any position not overlapped on the planar surface is possible Also, although the first interconnection pattern 340 and the second interconnection pattern 345 having straight-line shapes, the first and second interconnection patterns 340 and 345 can have various shapes capable of connecting the vias in series, such as at-least-one-time-turned straight-line shapes, curved shapes and spiral shapes.

In accordance with another embodiment of the present invention, the multi-via can include a first via, an interconnection pattern and a second via. In other words, the multi-via can be configured to include one interconnection pattern instead of two interconnection patterns as described above. The first via can have one end part, which is connected to the metal plate 320 and penetrates the first metal layer 313, and the other end part, which is connected to one end part of the interconnection pattern formed on the same planar surface as the third metal layer 316. The second via can have one end part, which is connected to the first metal layer 313, and the other end part, which is connected to the other end part of the interconnection pattern. In other words, the multi-via can be connected in series in the order of the first via, the interconnection pattern and the second via, so as to electrically connect the metal plate 320 and the first layer 313.

Also, in accordance with the aforementioned embodiments of the present invention, the multi-via can have a two-stacked in structure which passes through the same planar surface as the third metal layer 316 by penetrating the first metal layer 313 from the metal plate 320 and faces the first metal layer 313 again. However, beside that, the multi-via can include a multi-stacked in structure which passes through the same planar surface as a fourth metal layer outside the third metal layer 316 by penetrating the third metal layer 316 or passes through the same planar surface as a fifth metal layer outside a fourth metal layer by penetrating the fourth metal layer as well and faces the first metal layer 313 again.

A mushroom type structure can include the metal plate 320 and the multi-via 350. Two or more mushroom type structures can be formed in the printed circuit board. In this case, the metal plate 320 can be arranged in the same planar surface between the first metal layer 313 and the second metal layer 310 or in a different planar surface.

Also, the multi-vias of the different mushroom type structures can face different metal layers. In other words, even though the multi-via of any one of the different mushroom type structures can face the first metal layer as illustrated in FIG. 6 through FIG. 8, the multi-via of another structure can face the second metal layer. In this case, the multi-via can extend to an outer layer of the second metal layer.

The case that a plurality of mushroom type structures is arranged in the printed circuit board will be described as follows.

Figure 10:
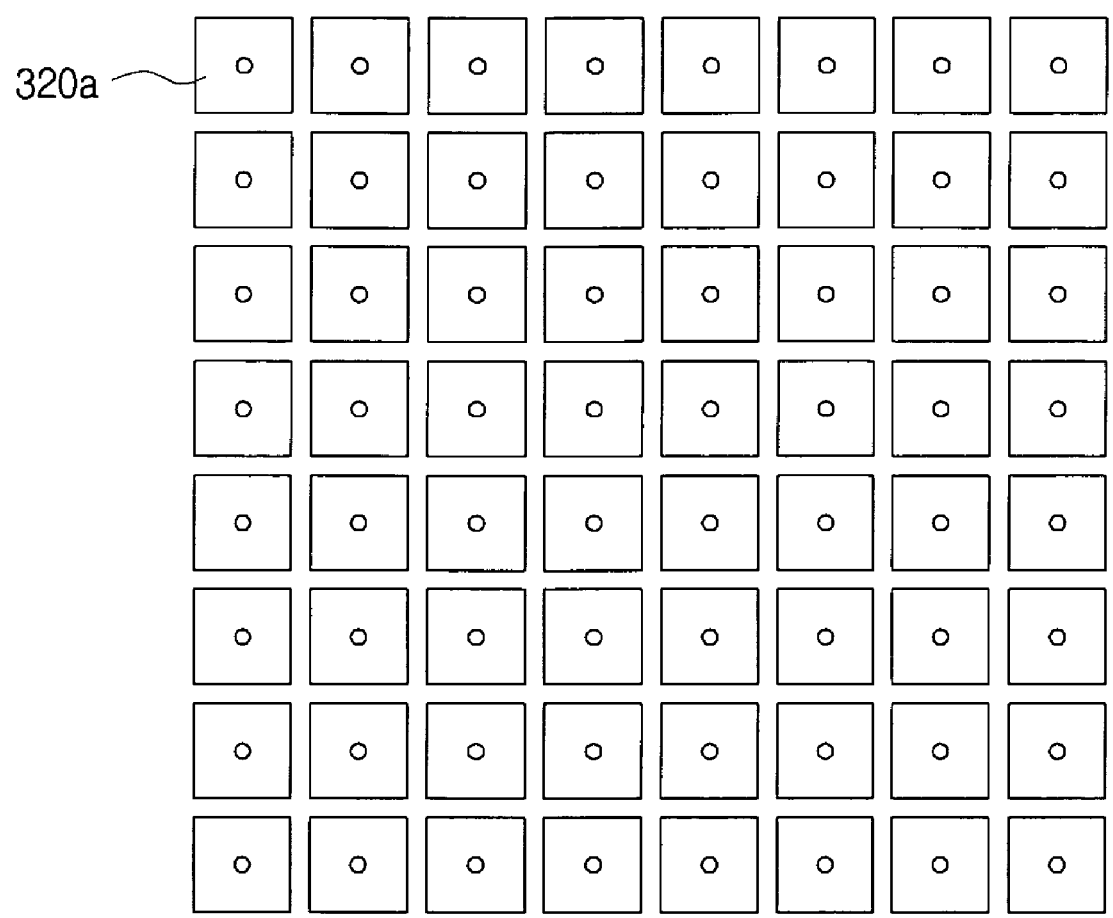
FIG. 10 a plan view showing a configuration of an electromagnetic bandgap structure including a square-shaped mental plate in accordance with an embodiment of the present invention.
Figure 11:
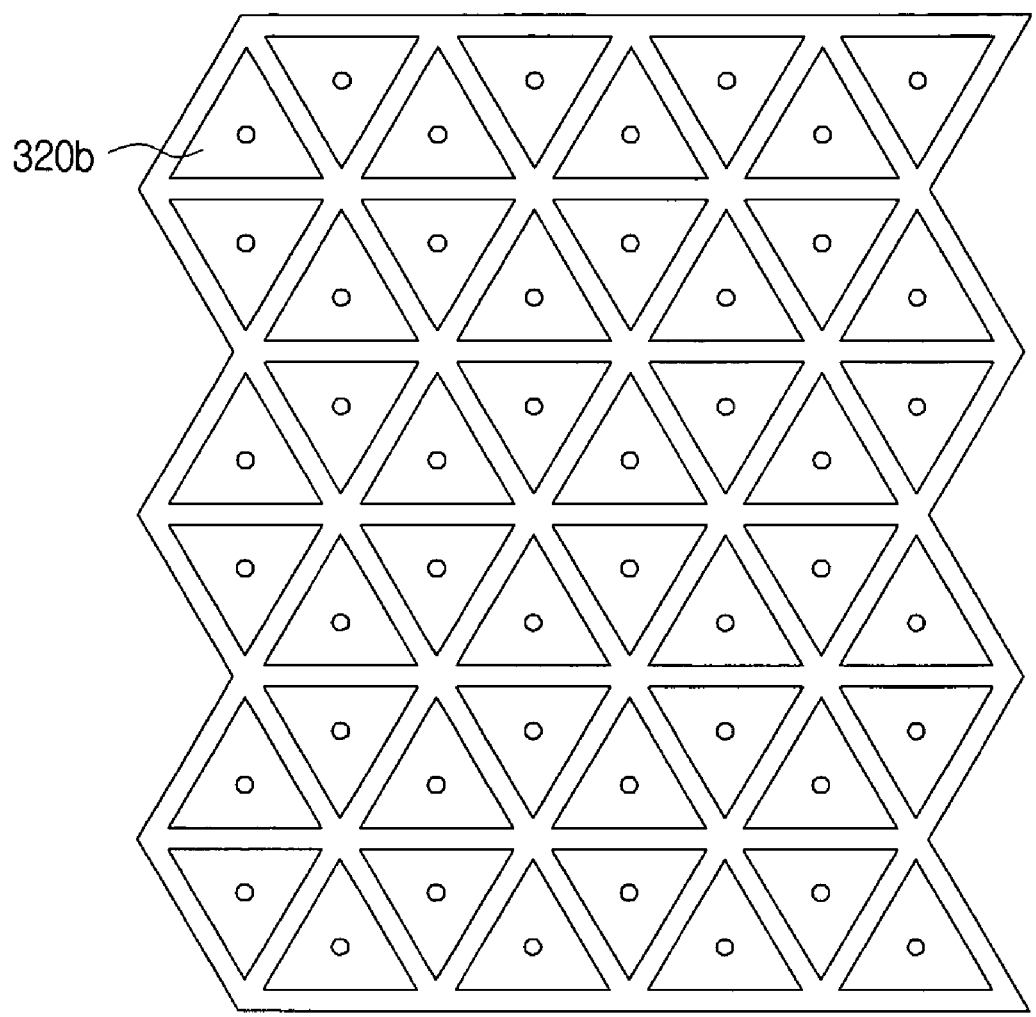
FIG. 11 is a plan view showing a configuration of an electromagnetic bandgap structure including a triangle-shaped mental plate in accordance with another embodiment of the present invention.
Figure 12:
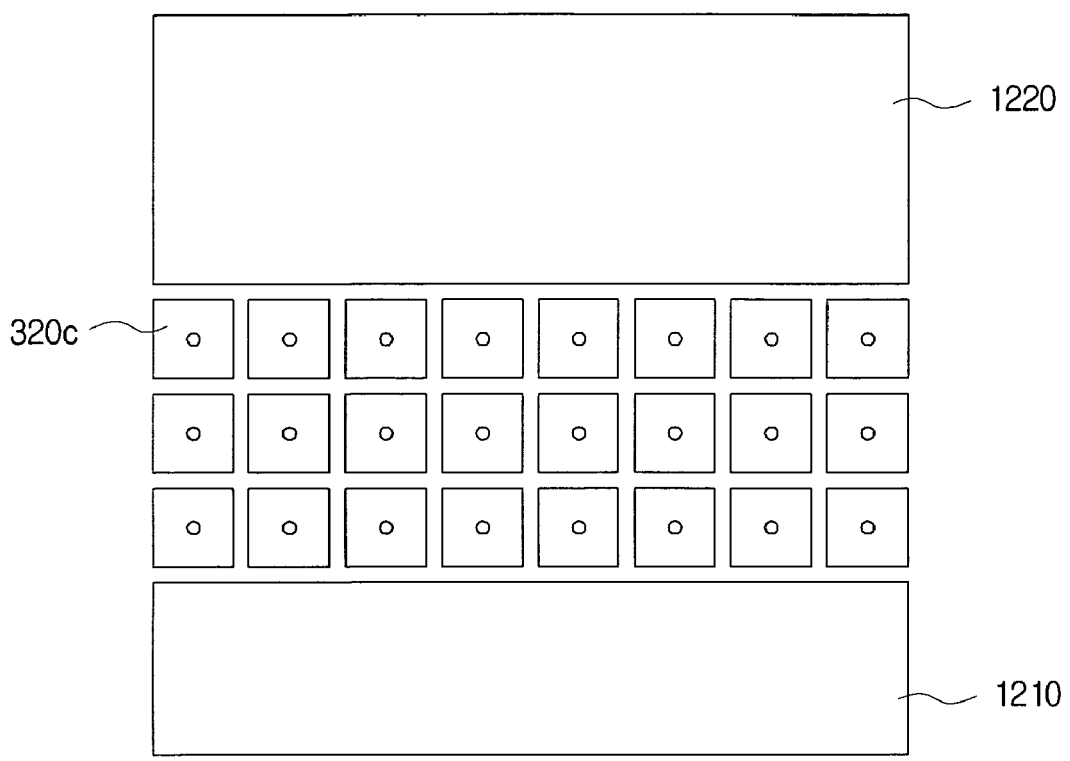
FIG. 12 is a plan view showing a band-shaped configuration of an electromagnetic bandgap structure in accordance with another embodiment of the present invention.

FIG. 10 a plan view showing a configuration of an electromagnetic bandgap structure including a square-shaped mental plate in accordance with an embodiment of the present invention, FIG. 11 is a plan view showing a configuration of an electromagnetic bandgap structure including a triangle-shaped mental plate in accordance with another embodiment of the present invention and FIG. 12 is a plan view showing a band-shaped configuration of an electromagnetic bandgap structure in accordance with another embodiment of the present invention.

The metal plate of the mushroom type structure can have various shapes such as polygonal shapes, for example, a triangle 320b (refer to FIG. 11) and a hexagon or a circle and an ellipse as well as a square shape 320a (refer to FIG. 10).

Also, the metal plates 320a and 320b can be arranged in an entire board (refer to FIG. 10 and FIG. 11) or metal plates 320c can be arranged in a part of a board (refer to FIG. 12). In the case of being arranged in a part, the digital circuit can be placed in a first area 1210 of the printed circuit board, and the analog can be placed in a second area 1220. The mushroom type structure can be arranged in a form of intersecting a signal transfer path between the digital circuit and the analog circuit.

Figure 13:
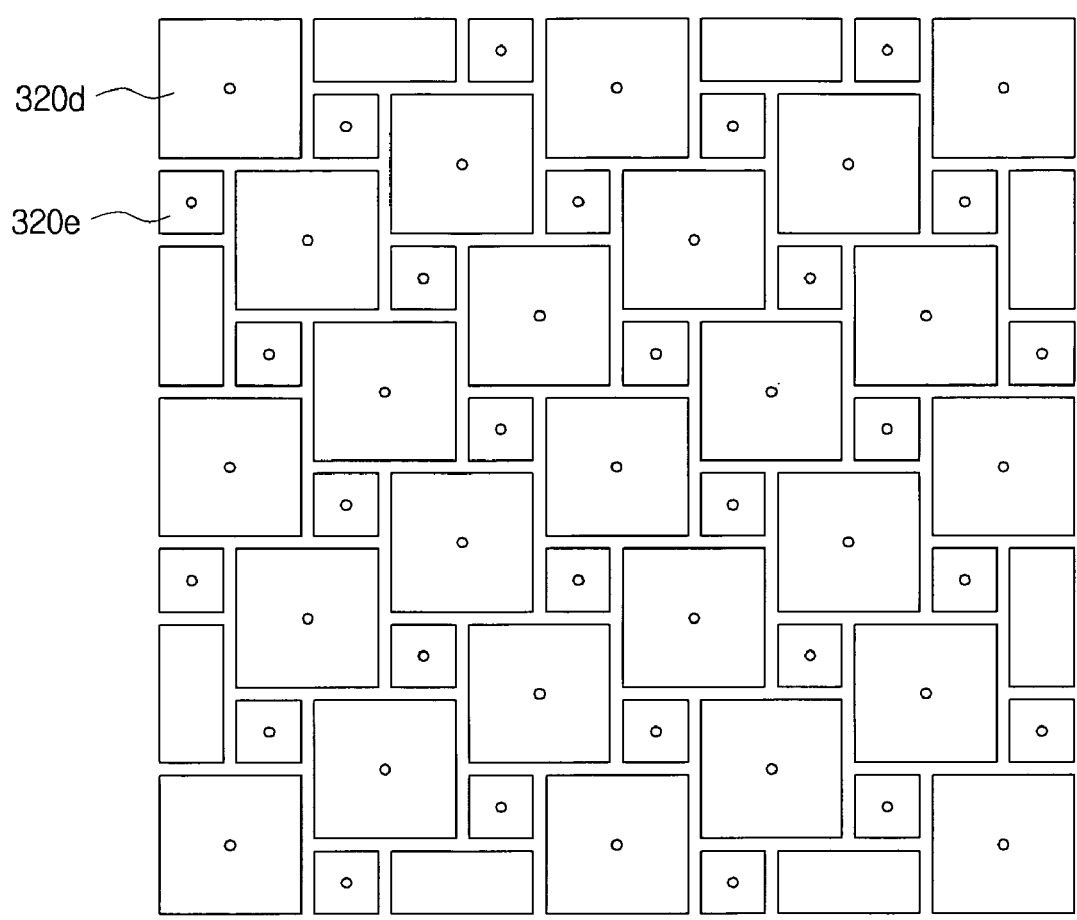
FIG. 13 and FIG. 14 are plan views showing a configuration according to the size of a mental plate in accordance with another embodiment of the present invention.
Figure 14:
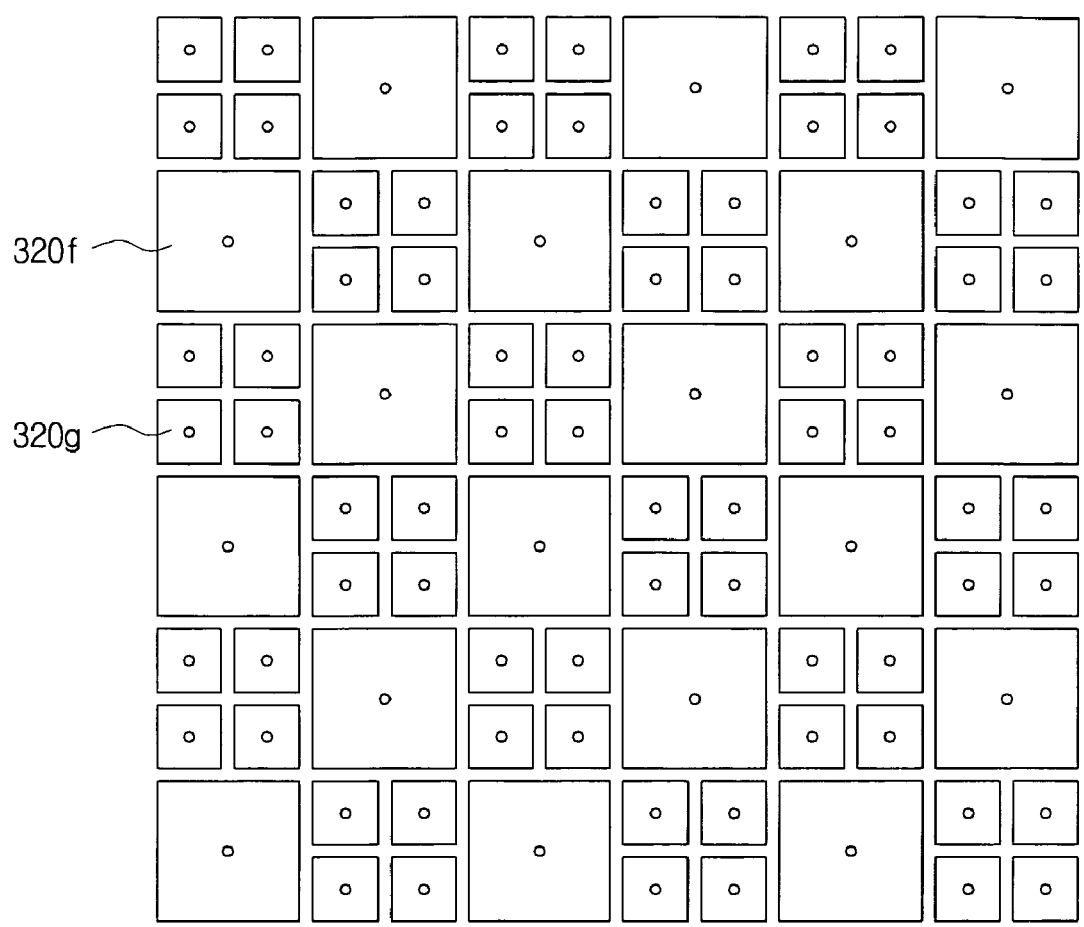

FIG. 13 and FIG. 14 are plan views showing a configuration according to the size of a mental plate in accordance with another embodiment of the present invention.

Although all metal plates of the mushroom type structure can have the same size as described above, the metal plates can have different sizes as illustrated in FIG. 13 and FIG. 14. In this case, the metal plates can be distinguished into a plurality of groups having different size.

Referring to FIG. 13, big metal plates B 320d having a relatively bigger size and small metal plates C 320e having a relatively smaller size can be alternately arranged.

Referring to FIG. 14, big metal plates D 320f having a relatively bigger size and small metal plates E1, E2, E3 and E4 320g having a relatively smaller size can be arranged. The small metal plates E1, E2, E3 and E4 are arranged in a 2×2 form. Each small metal plate E1, E2, E3 and E4 can have the similar area size to the large metal plate D 320f.

As described above, the arrangements combined with the differently sized metal plates can intercept to transfer a signal corresponding to a certain frequency or decrease corresponding noise.

Figure 15:
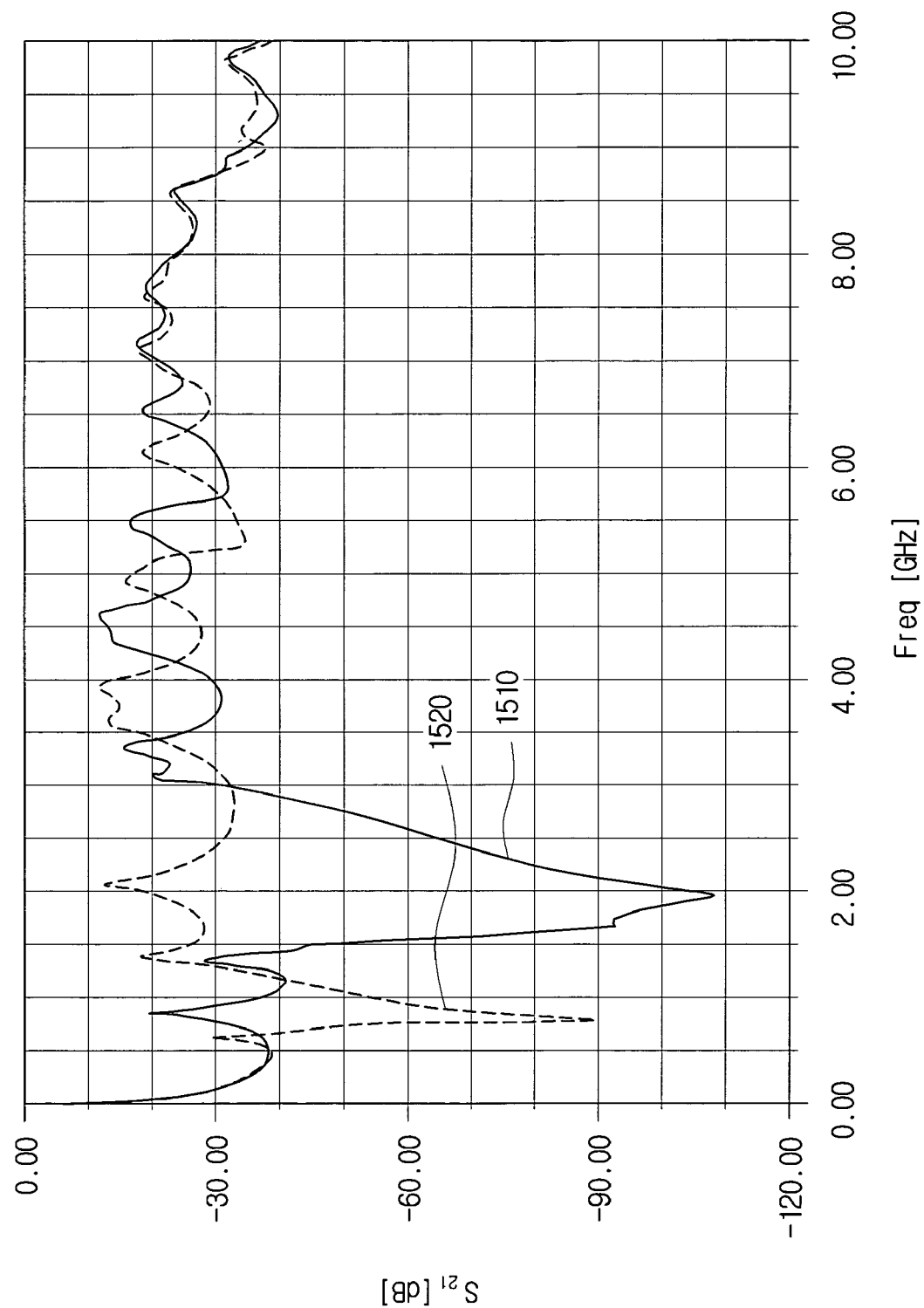
FIG. 15 is graphs showing computer-simulation results that use electromagnetic bandgap structures in accordance with a conventional structure and an embodiment of the present invention.

FIG. 15 is graphs showing computer-simulation results that use the electromagnetic bandgap structure 300 in accordance with an embodiment of the present invention and the electromagnetic bandgap structure 200 in accordance with a conventional structure.

Referring to FIG. 15, the case where the typical electromagnetic bandgap structure 200 has the same structure size (i.e. the metal plate size of 81 $mm^2$ (9×9), the second dielectric layer height of 35 μm, the first dielectric layer height of 100 μm and the gap of 1 mm between the metal plates) as that of the electromagnetic bandgap structure 300 in accordance with an embodiment of the present invention is illustrated.

The typical electromagnetic bandgap structure 200 can have the bandgap frequency band having 1.51~2.74 GHz in the (−)50 db and below like the graph 1510, while the electromagnetic bandgap structure 300 in accordance with an embodiment of the present invention can have the bandgap frequency band having 0.72~1.03 GHz in the (−)50 db and below like the graph 1520. This is charted in the following table 1.

TABLE 1

|  | Conventional structure (refer to FIG. 4) | Structure of an embodiment of the present invention (refer to FIG. 6) |
| --- | --- | --- |
| Cell size | 9 × 9 | 9 × 9 |
| Second dielectric layer height | 35 μm | 35 μm |
| First dielectric layer height | 100 μm | 100 μm |
| Gap | 1 mm | 1 mm |
| Band gap frequency | 1.51~2.74 GHz | 0.72~1.03 GHz |

In the case of the same size, the electromagnetic bandgap structure 300 in accordance with an embodiment of the present invention can shield the signal having lower frequency bands.

This can means that if the signal having the same frequency band is shielded, the electromagnetic bandgap structure 300 in accordance with an embodiment of the present invention can have the smaller size. In other words, the electromagnetic bandgap structure 300 can have high possibility of being applied to portable electronic apparatuses that can be miniaturized like a portable communication terminal.

Also, in accordance with embodiments of the present invention, the length of the via can be not limited according to the width of the dielectric layer. The small height of the first dielectric layer can result in the decrease of the via length. This may not cause the inductance to effectively be increased. However, in accordance with embodiments of the present invention, since the via extends to another metal layer, the entire extended length of the multi-via can be adjusted, to thereby use a space efficiently and acquire enough inductance.

Since the forgoing electromagnetic bandgap structure is arranged inside the printed circuit board having the analog circuit and the digital, realized therein together, the printed circuit board can prevent an electromagnetic wave, which ranges a certain frequency band, among the electromagnetic waves, transferred to the analog circuit and the digital, from being transferred.

In other words, despite the size of a small structure, it is possible to solve the foresaid problem mixed signals by restraining an electromagnetic wave having a certain frequency band, corresponding to noise in the analog circuit, from being transferred.

Although some embodiments of the present invention have been described, anyone of ordinary skill in the art to which the invention pertains should be able to understand that a very large number of permutations are possible without departing the spirit and scope of the present invention and its equivalents, which shall only be defined by the Claims appended below.

What is claimed is:

1. An electromagnetic bandgap structure comprising:
a first metal layer;
a second metal layer;
a metal plate, placed between the first metal layer and the second metal layer, the metal plate having a size;
a multi via; and
a dielectric layer, stacked between the first metal layer and the metal plate, between the second metal layer and the metal plate and between the first metal layer and the second metal layer,
wherein the multi-via comprises:
a first interconnection pattern, placed on a same planar surface as the second metal layer and formed in a clearance hole formed in the second metal layer,
a first via, connected to the metal plate and electrically connected to the first interconnection pattern, and
a second via, having an end part, which is connected to the first metal layer, and an other end part, which is connected to the first interconnection pattern.

2. The structure of claim 1,
wherein an end part of the first via is connected to the metal plate, an other end part of the first via is connected to the first interconnection pattern, and the first via penetrates a clearance hole formed in the first metal layer.

3. The structure of claim 1, wherein the multi-via further comprises:
a second interconnection pattern, placed on a same surface as the first metal layer and formed in a clearance hole formed in the first metal layer; and
a third via, having an end part, which is connected to the first interconnection pattern, and an other end part, which is connected to the second interconnection pattern,
wherein an end part of the first via is connected to the metal plate, and an other end part of the first via is connected to the second interconnection pattern.

4. The structure of claim 3, wherein the first interconnection pattern and the second interconnection pattern have a straight-line, an at least-one-time-turned straight-line shape, a curved shape and a spiral shape.

5. The structure of claim 1, wherein a plurality of mushroom type structures are placed between the first metal layer and the second metal layer, and
the mushroom type structures include the metal plate and the multi-via.

6. The structure of claim 5, wherein the metal plates of the plurality of mushroom type structures have the same size.

7. The structure of claim 5, wherein the metal plates of the plurality of mushroom type structures are distinguished into a plurality of groups having different metal plate sizes.

8. A printed circuit board including an analog circuit and a digital circuit, an electromagnetic bandgap structure including a first metal layer, a metal plate, a second metal layer, a multi-via and a dielectric layer being arranged between the analog circuit and the digital circuit,
wherein the metal plate is placed between the first metal layer and the second metal layer;
the dielectric layer is stacked between the first metal layer and the metal plate, between the second metal layer and the metal plate and between the first metal layer and the second metal layer,
wherein the multi-via comprises:
a first interconnection pattern, placed on a same planar surface as the second metal layer and formed in a clearance hole formed in the second metal layer,
a first via, being connected to the metal plate and electrically connected to the first interconnection pattern, and
a second via, having an end part, which is connected to the first metal layer, and an other end part, which is connected to the first interconnection pattern.

9. The printed circuit board of claim 8, wherein the first metal layer is any one of a ground layer and a power layer, and the second metal layer is the other of the ground layer and the power layer.

10. The printed circuit board of claim 8, wherein the analog circuit is a radio frequency (RF) including an antenna receiving a wireless signal from an outside.

11. The printed circuit board of claim 8,
wherein an end part of the first via is connected to the metal plate, an other end part of the first via is connected to the first interconnection pattern, and the first via penetrates a clearance hole formed in the first metal layer.

12. The printed circuit board of claim 8,
wherein the multi-via further comprises:
a second interconnection pattern, placed on a same surface as the first metal layer and formed in a clearance hole formed in the first metal laver; and
a third via, having an end part, which is connected to the first interconnection pattern, and an other end part, which is connected to the second interconnection pattern, wherein an end part of the first via is connected to the metal plate, and an other end part of the first via is connected to the second interconnection pattern.

13. The printed circuit board of claim 12, wherein the first interconnection pattern and the second interconnection pattern have a straight-line, an at least-one-time-turned straight-line shape, a curved shape and a spiral shape.

14. The printed circuit board of claim 8, wherein a plurality of mushroom type structures are placed between the first metal layer and the second metal layer,
the mushroom type structure includes the metal plate and the multi-via.

15. The printed circuit board of claim 14, wherein the metal plates of the plurality of mushroom type structures have the same size.

16. The printed circuit board of claim 14, wherein the metal plates of the plurality of mushroom type structures are distinguished into a plurality of metal plate groups having different sizes.

* * * * *

UNITED STATES PATENT AND TRADEMARK OFFICE
CERTIFICATE OF CORRECTION

PATENT NO. : 7,944,320 B2
APPLICATION NO. : 12/076650
DATED : May 17, 2011
INVENTOR(S) : Mi-Ja Han et al.

It is certified that error appears in the above-identified patent and that said Letters Patent is hereby corrected as shown below:

Column 9, Line 28, In Claim 1, delete "multi via;" and insert --multi-via;--, therefor.

Column 10, Line 42 (Approx.), In Claim 12, delete "laver;" and insert --layer;--, therefor.

Signed and Sealed this
Thirteenth Day of September, 2011

David J. Kappos
*Director of the United States Patent and Trademark Office*